United States Patent [19]

Inuiya et al.

[11] Patent Number: 4,682,212
[45] Date of Patent: Jul. 21, 1987

[54] SOLID-STATE IMAGE PICKUP DEVICE FOR PRODUCING COLOR-SEPARATED VIDEO SIGNALS BY USE OF AFTERIMAGE RISE-TIME

[75] Inventors: Masafumi Inuiya; Masatoshi Tabei, both of Kaisei, Japan

[73] Assignee: Fuji Photo Film Co., Ltd., Kanagawa, Japan

[21] Appl. No.: 694,037

[22] Filed: Jan. 23, 1985

[30] Foreign Application Priority Data

Jan. 26, 1984 [JP] Japan .................................. 59-10977

[51] Int. Cl.[4] .......................... H04N 9/07; H04N 9/04; G01J 3/50; H01J 5/16
[52] U.S. Cl. ........................................ 358/44; 358/41; 250/226
[58] Field of Search ....................... 358/41, 43, 44, 48; 250/226, 578

[56] References Cited

U.S. PATENT DOCUMENTS

| | | | |
|---|---|---|---|
| 3,717,724 | 2/1973 | Montgomery, III | 358/43 |
| 4,085,421 | 4/1978 | Gilmour | 358/43 |
| 4,404,586 | 9/1983 | Tabei | 358/43 |
| 4,419,696 | 12/1983 | Hamano et al. | 250/578 |
| 4,438,455 | 3/1984 | Tabei | 358/44 |
| 4,443,813 | 4/1984 | Tabei | 358/44 |
| 4,520,381 | 5/1985 | Moriguchi et al. | 250/226 |
| 4,533,940 | 8/1985 | Chappell et al. | 358/44 |
| 4,613,895 | 9/1986 | Burkey et al. | 358/41 |

Primary Examiner—James J. Groody
Assistant Examiner—Randall S. Svihla
Attorney, Agent, or Firm—Birch, Stewart, Kolasch & Birch

[57] ABSTRACT

An imaging apparatus includes a solid-state image pickup device having an array of photosensitive cells formed in a photoconductive layer on a semiconductor substrate, an optical system for focusing an image of an object on the cell array, an optical shutter for introducing light incident to the optical system to the cell array for a desired exposure time period, a read circuit for sequentially reading out video signals from the photosensitive cells, a storage unit for temporarily storing the video signals read out by the read circuit, an operational unit for reading out the stored picture element signals from the storage unit to form color-separated component video signals, and a control unit for controlling the read circuit, and a storage unit, and the operational unit in response to the shutter. The control unit causes the read circuit, the storage unit, and the operational unit from the cells at each of three time points included in a time period continuing from the initiation of the exposure time period to the end of an afterimage rise-time of the solid-state image pickup device. The operational unit forms three color-separated component video signals from the three fields of picture element signals stored in the storage unit.

12 Claims, 12 Drawing Figures

SOLID-STATE IMAGE PICKUP DEVICE FOR PRODUCING COLOR-SEPARATED VIDEO SIGNALS BY USE OF AFTERIMAGE RISE-TIME

BACKGROUND OF THE INVENTION

1. Field of the Invention

The present invention relates to a solid-state image pickup device, and in particular, to a solid-state image pickup device which inclues photosensitive cells formed in a laminated layer of a photoconductive material such as an amorphous semiconductor, and an imaging apparatus using such a device.

2. Description of the Prior Art

A solid-state image pickup device whose photosensitive cells formed with a photoconductive layer such as an amorphous semiconductor in a layer-built structure is advantageous in that it has a large numerical aperture with respect to incident light, and thus has a high sensitivity, so that the degree of freedom is designing the spectral sensitivity is great and a quite wide frequency range in which the device is sensitive is obtained. Moreover, blooming can be effectively suppressed. However, the afterimage phenomenon takes place in such a solid-state image pickup device, and is a drawback in using the device for taking pictures, especially in the form of motion pictures.

The afterimage phenomenon occurs at the rise time and fall time of the light incident on the photosensitive cells. In a still picture camera, for example, having an optical shutter and an image pickup device which develops a video signal at intervals of a field time period (1/60 second) at a signal rate of the standard television format, the level of the output video signal exponentially increases during a time period of about ten fields after the shutter opened to reach the stationary state in some cases. This is referred to as "afterimage rise-time" in the specification. After the shutter is closed, the output signal level exponentially decreases during a time period of about three fields to reach zero. This is called "afterimage fall-time" in the description.

These afterimages are caused by photocarrier traps existing in an amorphous semiconductor substance used as a photoconductive layer. The rise-time afterimage occurs when photocarriers generated by an incident light are captured by the traps so that the number of movable carriers to be measured in the form of a signal current is increased while such traps are filled according to the probability corresponding to the Boltzmann distribution. This event causes a delay time required for the output video signal to be set to the stationary state. Similarly, the fall-time afterimage is caused when photocarriers captured by such traps are decreasingly released according to the same probability.

A measurement of the spectral sensitivity characteristics of the rise-time afterimage has revealed the fact that the characteristics change depending on the rise time. This is because an incident light having a longer wavelength reaches the deeper position measured from the surface of the photoconductive layer to excite photocarriers, which arrive earlier at the pn junction disposed under the photoconductive layer for storing and transferring photocarriers.

Paying specific attention to the afterimage characteristics which have been regarded as a drawback of an image pickup device of the layer-built type, we have come to an idea of an image pickup device positively utilizing the characteristics for the color separation of the video signals. In accordance with this idea, a color camera system can be implemented which does not require the provision of a color separation optical filter to be disposed on the photosensitive cell array. This system is by no means inferior to a field-sequential image pickup system with respect to the operation for supplying video signals without causing the color irregularity between generated video signals, even for a moving object.

SUMMARY OF THE INVENTION

It is therefore an object of the present invention to provide a solid-state image pickup device which can produce video signals advantageously having undergone color separation without causing any color irregularity between the video signals.

It is also an object of the invention to provide an imaging apparatus using such an image pickup device.

In accordance with the present invention, there is provided an imaging apparatus utilizing a solid-state image pickup device, comprising; a solid-state image pickup device having an array of photosensitive cells formed in a photoconductive layer on a semiconductor substrate, optical means for forming an image of an object focused on said array, optical shutter means for introducing light to said optical means to said array for a desired exposure time period, read means for sequentially reading out picture element signals from a plurality of cells, store means for temporarily storing the picture element signals read out by said read means, operational means for reading out the stored picture element signals from said store means to form video signals having undergone color separation, and control means for controlling said read, store, and operational means in response to said shutter means, said control means allowing said read means to read out a field of picture element signals from said cells to store the signals in said store means at each of three time points included in a time period extending from the beginning of the exposure time period to at least the end of the rise-time afterimage of said solid-state image pickup device, said operational means forming three color component video signals having undergone color separation from three fields of picture element signals stored in said store means to produce the video signals.

In accordance with the present invention, a solid-state image pickup device comprises a semiconductor substrate, and an array of photosensitive cells formed on the substrate so as to produce, when driven, video signals associated with light incident to the array, each of said photosensitive cells comprising a first plurality of layers of a photoconductive material laminated over said substrate, and at least one second layer partially disposed between adjacent ones of said first layers and comprising a non-photosensitive material which is substantially transparent with respect to the incident light.

BRIEF DESCRIPTION OF THE DRAWINGS

The objects and features of the present invention will become more apparent from the consideration of the following detailed description taken in conjunction with the accompanying drawings in which:

FIG. 7A shows explanatorily the symbols of the circuit elements used in FIG. 7;

DESCRIPTION OF THE PREFERRED EMBODIMENTS

Embodiments utilizing a solid-state image pickup device of the present invention will be described in detail by referring to the accompanying drawings.

Figure 1:
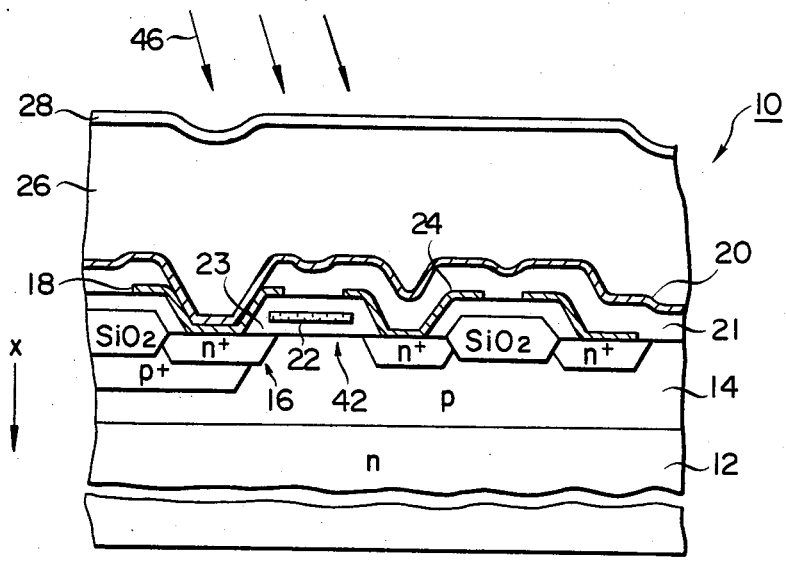
FIG. 1 is a vertical cross-sectional view conceptually illustrating the configuration of a photosensitive cell in an example of a solid-state image pickup device utilizing amorphous semiconductor as a photoconductive layer.

FIG. 1 is a conceptual, vertical cross-sectional view showing a photosensitive cell 10 of an example of a solid-state image pickup device in which a layer of amorphous semiconductor is utilized as a photoconductive layer. In this example, a photocarrier storage device 16 is formed on a p-type epitaxial layer 14 expitaxially grown on a primary surface of an n-type silicon substrate 12. As depicted in FIG. 1, two electrode layers 18 and 20 each made of a material such as aluminum is formed thereon with an insulating material layer 21 disposed therebetween. A polycrystalline layer 22 separated by an insulating material layer 23 constitutes an MOS switching element 42, while a third aluminum layer 24 forms an output line for reading a video signal from the diode 16.

A semiconductor layer 26 made of an amorphous substance is grown on the aluminum layer 20 in order to configure a photoconductive layer. In addition to the amorphous silicon hydrate (a-Si:H), a ZnSe—ZnCdFe layer, a Se—As—Te layer, or the like is utilized to form a photoconductive layer. A transparent electrode 28, made of a material such as ITO (In$_2$O$_3$—SnO$_2$), is formed on the photoconductive layer 26.

Figure 2:
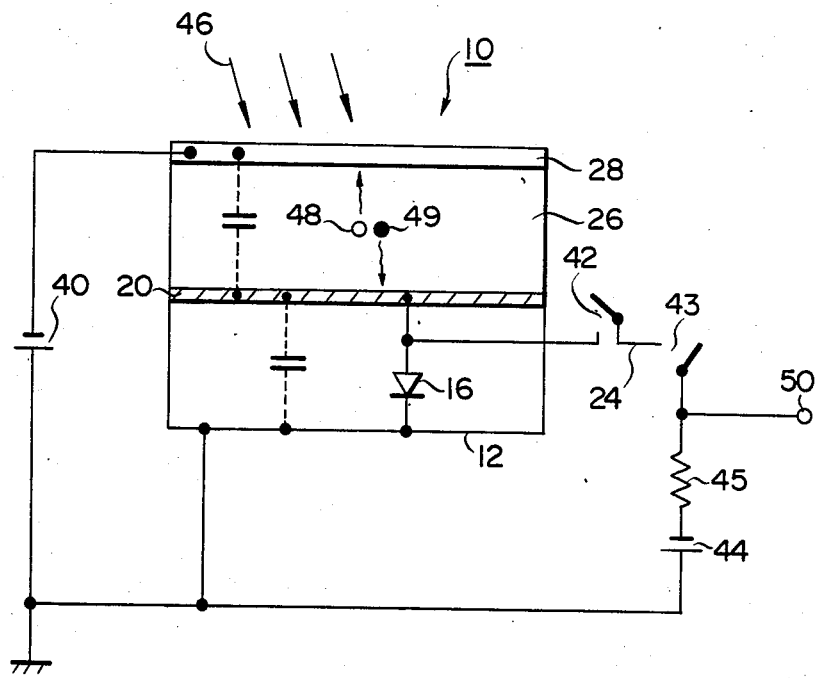
FIG. 2 is a schematic circuit diagram showing an equivalent circuit of a photosensitive cell of FIG. 1.

FIG. 2 is an equivalent circuit diagram depicting the photosensitive cell 10 of FIG. 1. As can be seen from this circuit diagram, the substrate 12 is grounded and the transparent electrode 28 is biased with a negative potential from a direct current (dc) power supply 40. The storage diode 16 has an anode connected to a video power supply 44 via readout switches 42 and 43 and a load resistor 45.

Although the switch 42 is conceptually depicted in the form of a contact point, an MOS switching element shown in FIG. 1 is also applicable. This is also the case for the switch 43. In an actual case, the photosensitive cells 10 are arranged to form an array having rows and columns; consequently, a photosensitive cell is connected to an MOS switching element 42 for selecting a horizontal row and to an MOS switching element 43 for selecting a vertical column, each being connected in series when represented in an equivalent circuit diagram. Without using such an MOS structure, it is also applicable to form electric charge transfer paths in a charge-coupled device structure.

In the solid-state image pickup device 10 including the above-stated photosensitive cells formed with amorphous semiconductor in a layer-built structure, the holes 48 among the photocarriers generated by the incident light 46 to the photoconductive layer 26 are fed toward the transparent electrode 28, while the electrons 49 are captured by the aluminum layer 20 to be collected in the other aluminum layer 18. The collected electrons are then transferred to the storage diode 16. When the readout switches 42 and 43 are closed, a current associated with the carriers stored in the diode 16 flows to be delivered as an output video signal to an output terminal 50.

As described hereabove, photocarriers generated by the incident light 46 are captured by traps existing in the photoconductive layer 26, and the number of movable carriers which can be measured in the form of a signal current is gradually increased as the traps are filled according to the probability conforming to the Boltzmann distribution, with the remaining carriers tranferred to the diode 16 by the effect of the bias applied from the power supply 40. Since this causes a time lag before the output video signal is set to its stationary state, the rise-time afterimage takes place as discussed before.

Figure 3:
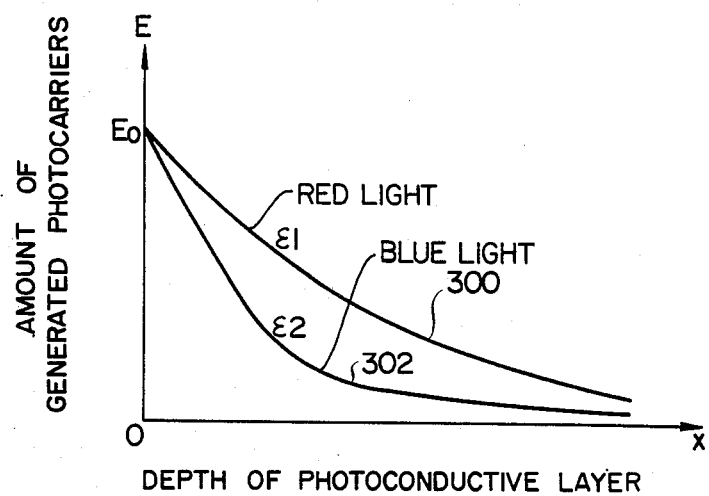
FIGS. 3 through 6 are explanatory diagrams useful for understanding the fundamental principle of the present invention utilizing the afterimage characteristics of a solid-state image pickup device of the layer-built type.

The amount E of the photocarriers excited in the photoconductive layer 26 by the incident light 46 exponentially decreases with respect to the depth x measured in the direction perpendicular to the surface of the layer 26, where x is zero on the surface as depicted in FIG. 3. The change of E is expressed as follows:

$$E(x) = E_0 e^{-\epsilon x} \quad (1)$$

That is, the value of E decreases more steeply for an incident light having a shorter wavelength because the absorption coefficient $\epsilon$ of the photoconductive layer 26 with respect to light varies in dependence upon wavelengths.

For the photoconductive layer 26 made of semiconductor, the coefficient $\epsilon$ is generally smaller as the wavelength of the incident light becomes longer, that is, in the neighborhood of the red light region; hence, the incident light penetrates into a relatively deeper position to excite photocarriers thereat.

Consequently, a curve 300 indicated with $\epsilon 1$ results, FIG. 3. A blue light, having a shorter wavelength, has a larger value for $\epsilon$ to excite photocarriers mainly in a shallow place near the surface; hence, a curve 302 indicated with $\epsilon 2$ may be plotted.

The absorption coefficient of amorphous silicon is, for instance, approximately $10^4$/cm for a red light having a wavelength of about 650 nm, and the depth x at which the incident light is decreased to 1/e (where e is the base of the natural logarithm) of the original value is about 1 $\mu$m; whereas these values of a blue light having a wavelength of about 400 nm are approximately $10^5$/cm and 0.1$\mu$m, respectively. Consequently, the thickness of the photoconductive layer 26 is sufficiently set to about 2 $\mu$m.

Figure 4:
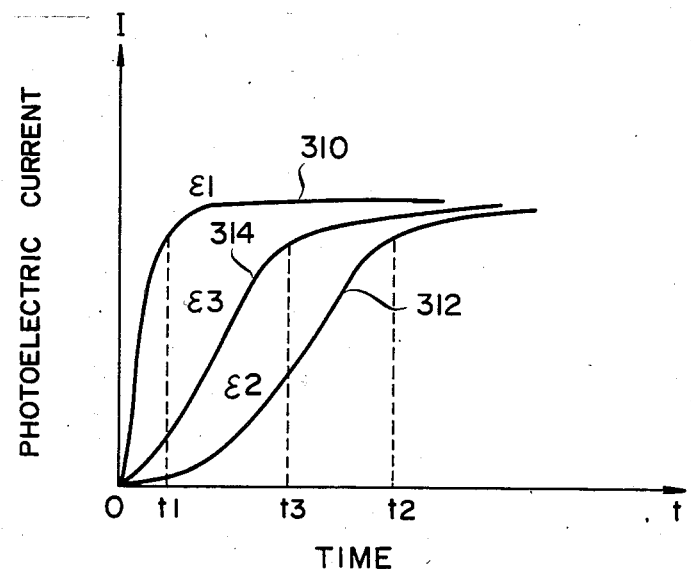

As described before, photocarriers excited in the photoconductive layer 26 are fed therethrough toward the storage diode 16 by the bias supplied from the power supply 40, and are captured by traps in the layer 26 according to a certain probability. In FIG. 4, therefore, when the layer 26, which has been kept unexposed, is brought into exposure to the incident light 46 at time t=0, the photocarriers generated in almost all portions of the layer 26 by the light having a small absorption coefficient ε1 are trapped all over the portions; however, the time required to fill these traps is relatively shorter so that a current I reaches the stationary state in a relatively shorter-period of time. As depicted in FIG. 4, the time period elapsed from t=0 to t=t1, at which the current I is set to a value almost equal to the stationary current, is regarded as the period of time required for filling the trap.

In contrast, the photocarriers generated mainly in the vicinity of the surface of the layer 26 by the light having a larger absorption coefficient ε2 are transferred to the deeper locations in the layer 26 while filling these traps therein, so that a relatively long period of time is required for the current to reach the stationary state, as indicated by a curve 312 of FIG. 4. The time period elaped between t=0 and t=t2, at which the current almost reaches the stationary state as illustrated in FIG. 4, is considered to be required for the trap capture and transit operations. Attention should be directed to the fast that the ordinate of the graph shown in FIG. 4 represents the normalized value of the photoelectric current I.

If the electric charge stored in the diode 16 is sampled during the period between the time points t1 and t2, the current is mainly caused by light for which the absorption coefficient is ε1, that is, the current mainly generated by the component in the red light range is obtained. If the electric charge stored in the diode 16 is sampled at a point after the time t2, a current is obtained which represents the total of the current generated by the incident light having both a smaller absorption coefficient ε1 and a larger absorption coefficient ε2.

Similarly, since a curve 314 is obtained as the photocurrent output response with respect to an incident light for which an intermediate absorption coefficient ε3 is developed, if the electric charge stored in the diode 16 is sampled at a point in the vicinity of the time t3, at which the current almost reaches the stationary state, a current is obtained which represents the total of the current generated by the light associated with a smaller absorption coefficient ε1 and that caused by the light associated with an intermediate absorption coefficient ε3. The video signals of the respective color components can be therefore extracted by processing signals obtained from these currents.

Figure 5:
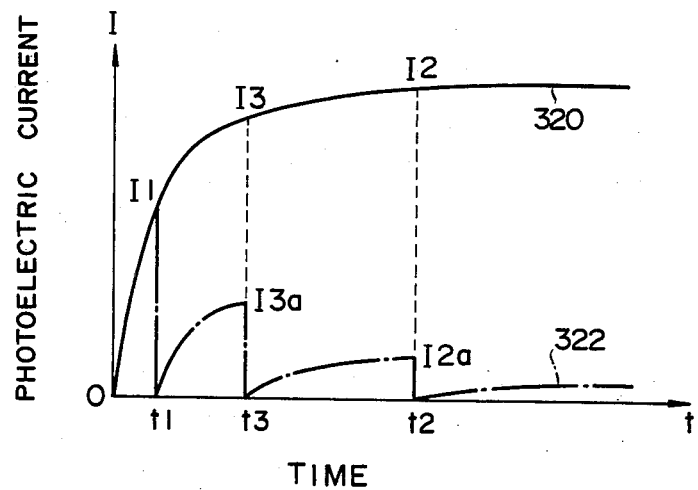
Figure 6:
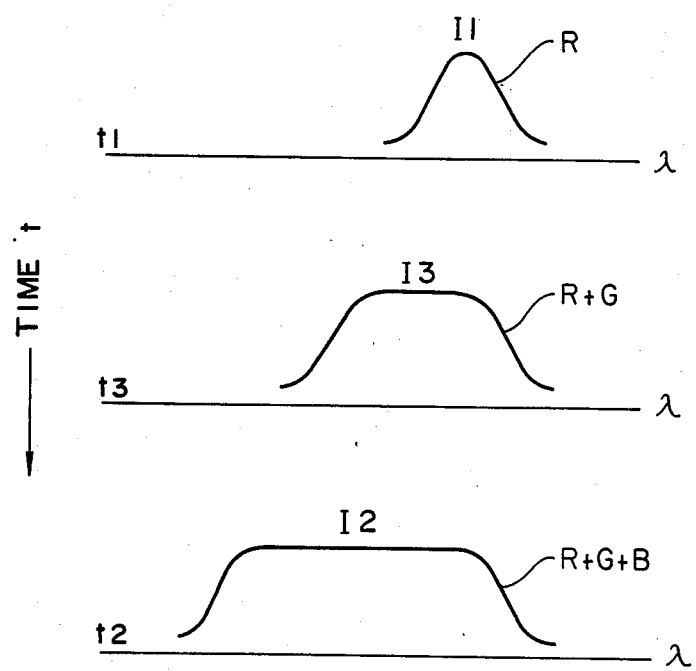

Assume that a light irradiation on a photosensitive cell 10 is started at time t=0, and that the total current developed from the cell 10 increases along a curve 320 as the time t elapses, as shown in FIG. 5. As can be clear from the description hereinabove, the photocurrents I1, I3, and I2 at time t1, t3, and t2, respectively, possess such distribution characteristics with respect to wavelength λ as depicted in FIG. 6. When these photocurrents I1, I3, and I2 are respectively read out at time t1, t3, and t2, the actual photocurrent changes with respect to time as indicated by a dot-chain line 322 (I1-→I3a→I2a) of FIG. 5. Based on this phenomenon, signals R, G, and B substantially representing the red, green, and blue components, respectively, can be calculated by the following expressions.

$$\left. \begin{array}{l} R = I1 \\ G = I3a - \alpha \cdot I1 \\ B = I2a - \beta \cdot I3a - \gamma \cdot I1 \end{array} \right\} \quad (2)$$

Where, $\alpha$, $\beta$, and $\gamma$ are coefficients associated with the spectral sensitivity characteristics of the photoconductive layer 26.

Figure 7:
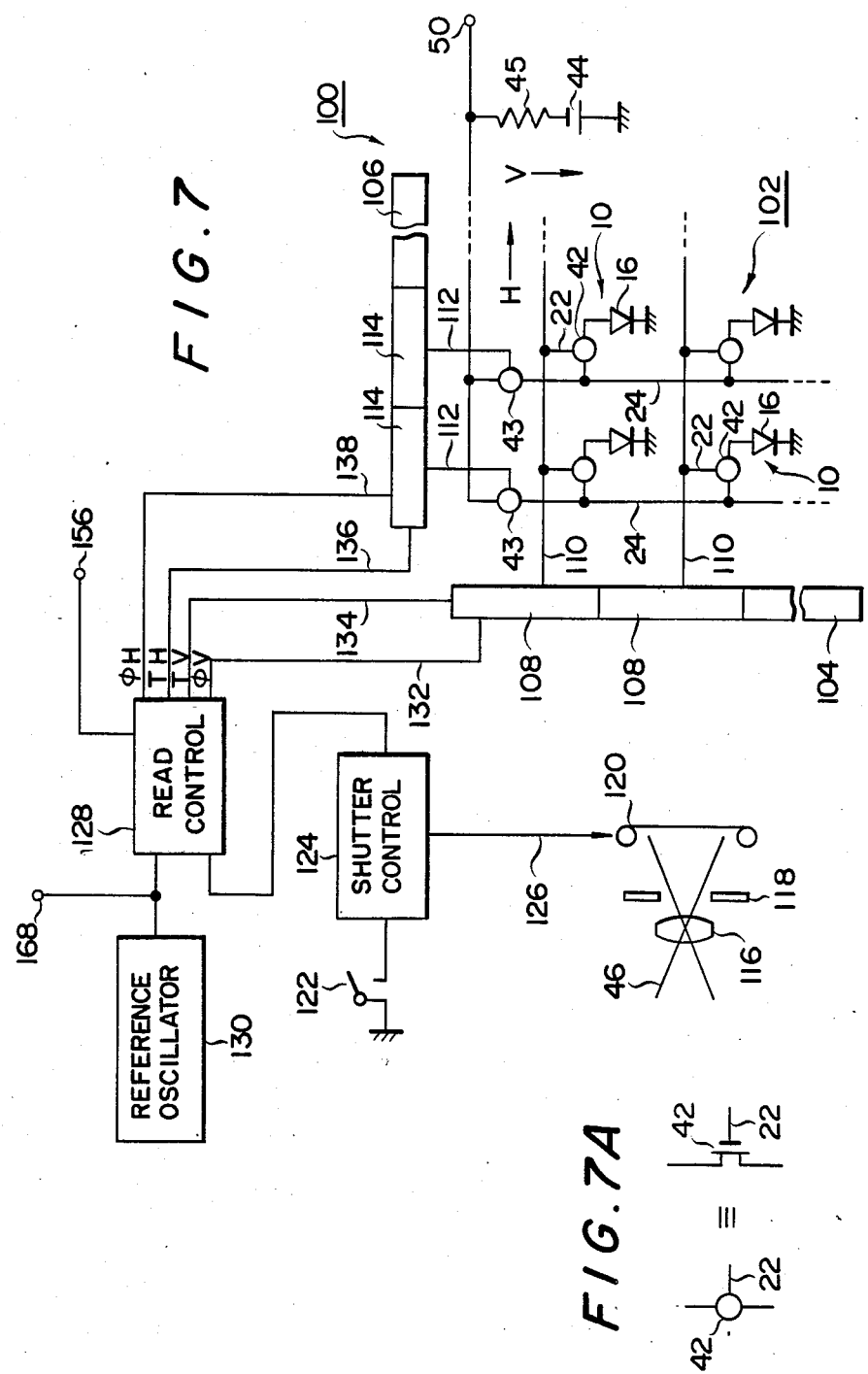
FIGS. 7 and 8 are schematic block diagrams depicting an embodiment of imaging apparatus in accordance with the present invention.
Figure 8:
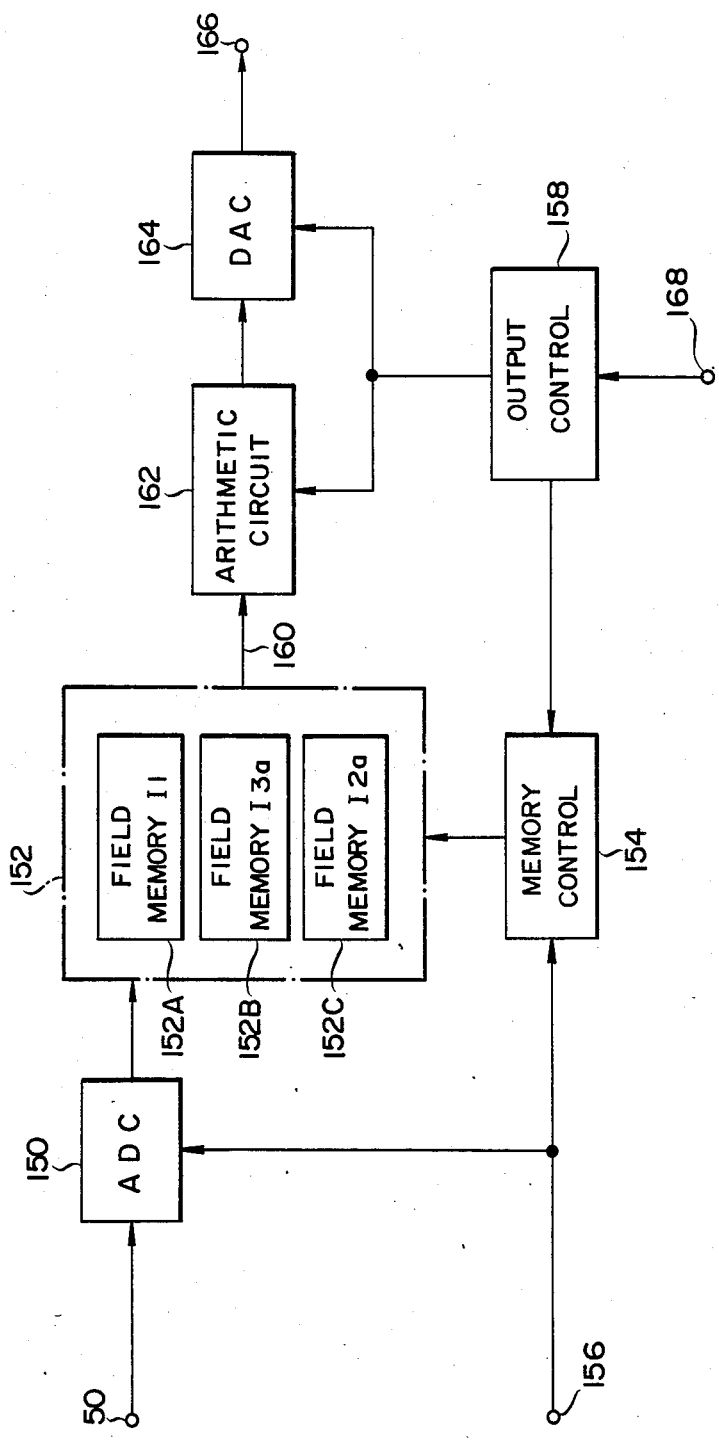

The principle of the present invention will be embodied by imaging apparatus illustrated in FIGS. 7 and 8.

FIG. 7 illustrates an embodiment of the imaging apparatus according to the present invention in which the main section thereof, that is, a solid-state image pickup device 100 formed on a chip comprises a photosensitive cell array 102 having rows and columns formed with photosensitive cells of FIG. 1, a vertical shift register 104, and a horizontal shift register 106. For example, the photosensitive cell array 102 comprises the photosensitive cells disposed in a matrix formed by 242 horizontal scanning lines in a vertical direction V and 256 picture elements, or pixels, in a horizontal direction H, and hence the shift registers 104 and 106 are each provided with the corresponding number of register stages.

Each register stage 108 of the vertical shift register 104 is utilized to drive the associated horizontal row select line 110, each of which is connected to a gate 22 of the switch 42. Although the switch 42 is, like the switch 43, configured with an MOS switch as shown in FIG. 7A in this embodiment, it is represented with a small circle in FIG. 7 to simplify the schematic circuit diagram. A source-drain path has an end connected to the diode 16 and another end connected to the vertical line, i.e. the video signal read line 24.

The vertical lines 24 are commonly connected to the video signal output terminal 50 via the source-drain paths of the MOS switches 43 respectively on a vertical column basis. The MOS switch 43 has a gate 112 connected to a register stage associated with the horizontal shift register 106.

The imaging apparatus, on the other hand, is provided with an image pickup lens 116 for focusing an image of an object 140 on the photosensitive cell array 102 of the image pickup device 100. The light 46 passing through the image pickup lens 116 may land on the photosensitive cell array 102 through a diaphragm 118 and an optical shutter 120.

The open and close operations of the optical shutter 120 are driven by a shutter control circuit 124 responsive to a shutter release button 122 as conceptually indicated with an arrow 126. The shutter control 124 also controls a read control circuit 128, which produces various timing signals from the reference clock signal generated by a reference oscillator 130 so as to drive the solid-state camera device 100.

The read control circuit 128 delivers a clock signal φV and a driving pulse TV to the vertical shift register 104 over signal lines 132 and 134, respectively. It also supplies the horizontal shift register with a clock signal φH and a driving pulse TH on the signal lines 134 and 136, respectively.

In the present embodiment, a video signal is developed from the output terminal 50 at a signal rate nearly equal to that of the ordinary television signal. Consequently, the clock signal φV is used for stepping pulses through register stages 108 of the vertical shift register 104 at the intervals of a horizontal scanning time period (H), while the clock signal φH is used to allow register stages 114 of the horizontal shift register 106 to conduct a shifting operation at the intervals of a picture element time period.

The output terminal 50 supplies a picture element signal to an analog-to-digital converter (ADC) 150 of FIG. 8 so as to convert the signal into a corresponding digital signal, which is then fed to and stored in a memory unit 152. The memory unit 152 is a digital field memory having a storage capacity for storing therein video signals associated with the number of picture elements contained in at least three fields, which are represented as three storage areas 152A, 152B, and 152C in FIG. 8. These areas need not be naturally fixed beforehand, but only arbitrary areas need be available in the memory unit 152. A memory control unit 154 controls the memory unit 152 in terms of, for example, allocating the storage areas, for addressing, and for read-out and write-in operations.

The memory control circuit 154 receives control signals from a read control circuit 128 on a conrol line 156 such as a write command, addressing, and timing signals in order to conduct storage control for storing picture element signals, which will be described later. Picture element signals are read out from the memory unit 152 under the control of the memory control circuit 154 in response to the control signals such as the write, addressing, and timing signals supplied from an output control circuit 158. This operation will be also described later. These read control signals are generated by the output control circuit 158 from the reference clock signal fed from the reference oscillator 130 on a control line 168.

The memory unit 152 has a read output 160 connected to an arithmetic circuit 162, which executes an arithmetic operation on the readout picture element signal in accordance with the expression (2) described before. The signal is separated into three color components, R, G, and B through this arithmetic operation. The resultant signals are converted into corresponding analog signals by a digital-to-analog converter (DAC) 164, and then they are produced in the form of field sequential video signals having undergone the color separation from a video signal output terminal 166. Timing for the arithmetic operation and conversion to be executed in the arithmetic circuit 162 and digital-to-analog converter (DAC) 164, respectively, are controlled by the output control circuit 158.

Referring now to the explanatory schematic diagram of FIG. 9, the operation of this apparatus will be described.

Figure 9:
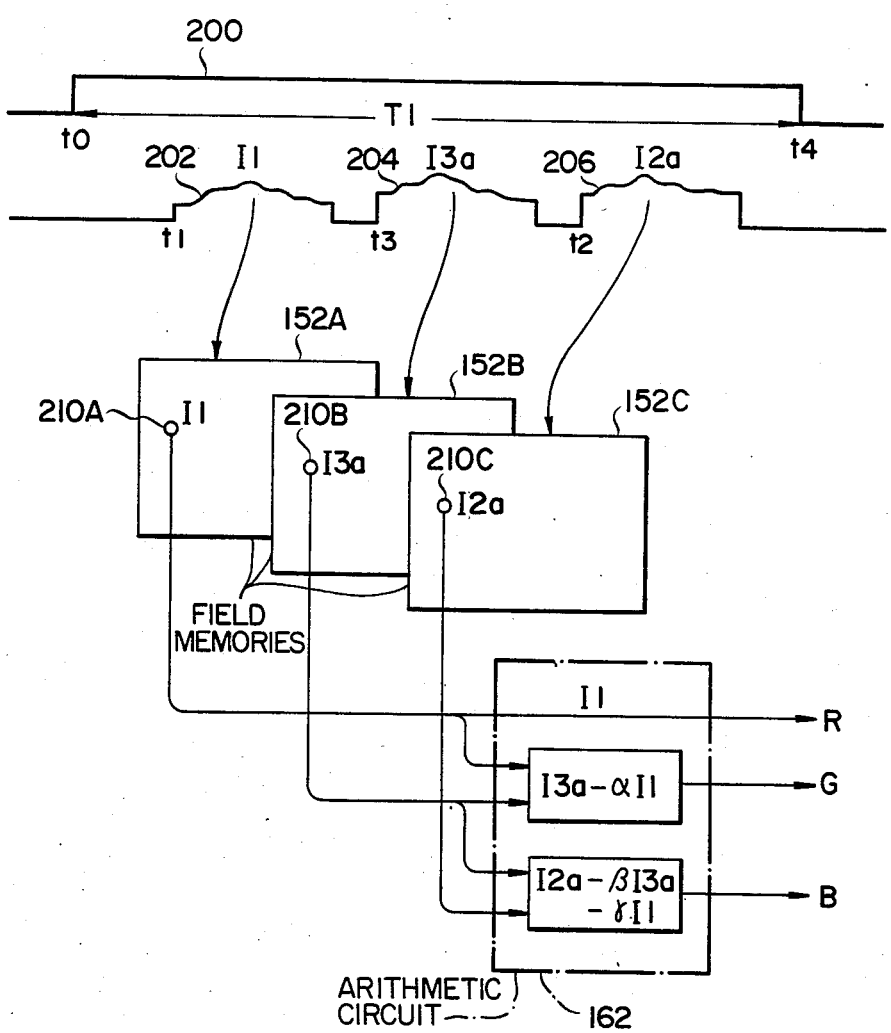
FIG. 9 is a conceptual schematic diagram useful for understanding the operation of the embodiment depicted in FIGS. 7 and 8.

When the shutter release button 122 is depressed at time t0 to make the contact point closed, the shutter control circuit 124 operates in turn so as to open the optical shutter 120 for a preset exposure time period T1 as indicated by a waveform 200 shown in FIG. 9. During this exposure time period, an image of an object is focused on the photosensitive cell array 102 so that photocarriers are generated in the photoconductive layer 26 of photosensitive cells 10. The magnitude of the photocarriers thus generated depends on the intensity of the incident light 46. As described before, a portion of the generated photocarriers is captured by traps existing in the photoconductive layer 26 to fill these traps according to a probability conforming to the Boltzmann distribution, while the remaining portion of the photocarriers is drifted to the diode 16 by the bias voltage applied from the power supply 40. In this case, the rise-time afterimage appears as described before.

To minimize the effect of the rise-time afterimage, the read control circuit 128 measures the period of time elapsed from the time t0 in order to start the read operation on the image pickup device 100 at time t1, at which the operation of capturing photocarriers by the traps are substantially completed with respect to the incident light for which a smaller absorption coefficient $\epsilon 1$ is developed.

In more detail, the read control circuit 128 supplies clock signals $\phi V$ and $\phi H$ and drives pulses TV and TH associated with a field to the output lines 132, 138, 134, and 136, respectively. The cells of the array 102 then deliver a field of serial video signals indicated by the waveform 202 of FIG. 9 to the signal line 50. This results mainly from the photoelectric current associated with the smaller absorption coefficient $\epsilon 1$ described before, that is, video signals of the red light component. The read component signal I1 is fed through the analog-to-digital converter 150 to the memory unit 152 so as to be sequentially stored as a digital data item in an area such as the field memory 152A. The storage control is carried out by the memory control circuit 154 based on control signals supplied from the read control circuit 128.

Similarly, the read control circuit 128 reads a field of video signals again from the photosensitive cell array 102 at time t3 to store them in another area, for example, a field memory 152B in the memory unit 152. The time t3 is set to be almost equal to the time at which the traps are almost entirely filled with photocarriers generated by the incident light associated with an intermediate absorption coefficient $\epsilon 3$ with the remaining photocarriers reaching the diode 16.

Moreover, the read control circuit 128 drives the photosensistive cell array 102 for the third time at time t2 to read out therefrom a field of video signals to store the read signals in the remaining field memory 152C of the memory unit 152. The time t2 is determined to be substantially equal to the time when the traps are almost filled with photocarriers generated by the incident light associated with a larger absorption coefficient $\epsilon 2$ with the remaining photocarriers reaching the diode 16. Thereafter, the shutter control circuit 124 closes the shutter 120 at time t4, in the present instance.

The output control circuit 158 controls the memory control circuit 154 and arithmetic circuit 162 in order to generate the color component signals R, G, and B through the color separation. These signals are fed through the digital-to-analog converter 164 and are produced in the form of field sequential video signals from the output terminal 166. This operation is carried out under the control of the output control circuit 158 as described hereinafter.

First of all, a picture element data I1 stored in the memory area 152A is read out to form a field of video signals, which are then produced from the output terminal 166 at the field rate. Since the data reflects the signals generated by the incident light associated with a smaller absorption coefficient $\epsilon 1$, it is used as the R signal data.

When a field of R signals is completely developed, picture element data stored in two field memory areas 152A and 152B is fetched to sequentially produce therefrom the data items existing at picture element position 210A and 210B both corresponding to the same pixel position in a video screen, respectively. A picture element data item I3a readout from the field memory 152B reflects the signals obtained by the incident lights associated with a smaller and intermediate absorption coefficients $\epsilon 1$ and $\epsilon 3$.

The arithmetic circuit 162 executes the arithmetic operation represented by the arithmetic expression (2) described before on the two data items I1 and I3a associated with a picture element position to generate a G signal having undergone the color separation. The readout and arithmetic operations are executed at the field rate for all picture elements along the raster scanning direction on a screen so that the resultant signals are produced as the G component television video signals from an output terminal 166 of this apparatus. When these operations are conducted up to the last picture element data of that field, the G component video signals for the field have been produced at the television signal rate.

After a field of G signals are developed as explained above, the picture element data stored in two field memory areas 152B and 152C are read out in the similar manner to sequentially produce the picture element data items at positions 210B and 210C, both corresponding to the same position on the video screen, respectively. A picture element data item I2a readout from the field memory 152C reflects the signals caused by the incident lights associated with the absorption coefficient values ranging from a smaller value $\epsilon 1$ to a larger value $\epsilon 2$.

The arithmetic circuit 162 executes the arithmetic operation in accordance with the expression (2) on these three data items I2a, I3a and I1 for a picture element position to generate B component color signals, which are developed at the television signal rate as a field of B component video signals in the same way as described before. Three component color signals are thus produced in the form of field sequential video signals from the output terminal 166.

Figure 10:
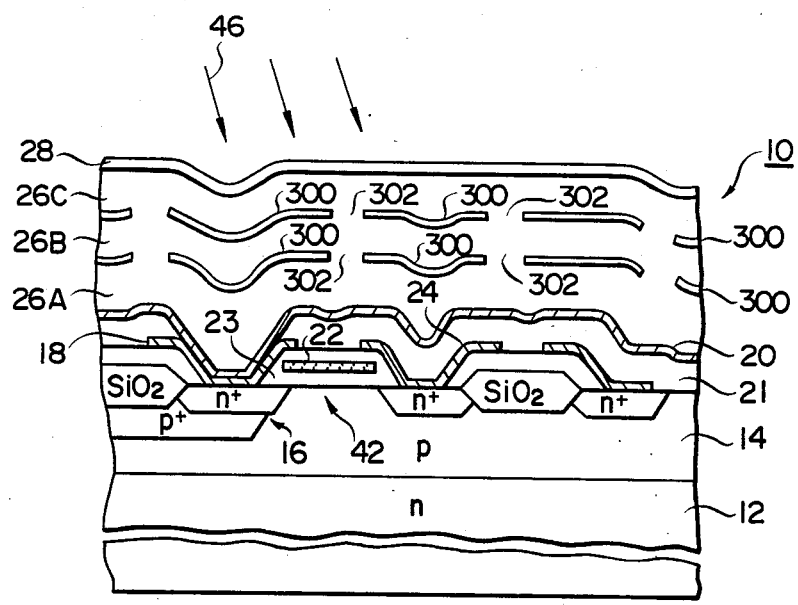
FIGS. 10 and 11 are conceptual cross-sectional views, similar to FIG. 1, illustrating alternative embodiments of the present invention.

FIG. 10 illustrates another embodiment of the present invention. In this embodiment, the photoconductive layer 26 of the embodiment shown in FIG. 1 is separated into three layers 26A, 26B, and 26C, and a non-photosensitive layer 300, which is not sensitive with respect to light, is inserted between each pair of the adjacent photoconductive layers. The non-photosensitive layers 300 are made of a material which passes an incident light 46 and excels no photocarriers therein, and may be formd in the shape of a net in which openings or meshes 302 are scattered. Photocarriers generated in the upper layers 26C and 26B are transferred through these openings 302 toward the diode 16. Non-photosensitive layers 300 may be formed so as to be dispersed at isolated locations, such as islands 300, in place of the non-photosensitive layers formed in the net shape.

With these non-photosensitive layers 300 thus disposed, the photocarriers generated in the layers 26A, 26B, and 26C by light having different absorption coefficients $\epsilon$, appropriately, are further separated so as to prevent the field sequential video signals comprising three separated color component signals from being mixed with each other.

Photoconductive layers 26A, 26B, or 26C may be formed of materials having different spectral characteristics. For example, it is quite advantageous to form the upper-most layer 26C with a material associated with a substantially larger absorption coefficient $\epsilon 2$, to form the intermediate layer 26B with a material having a substantially intermediate absorption coefficient $\epsilon 3$, and to form the lower-most layer 26A with a material having a substantially smaller absorption coefficient $\epsilon 1$.

Figure 11:
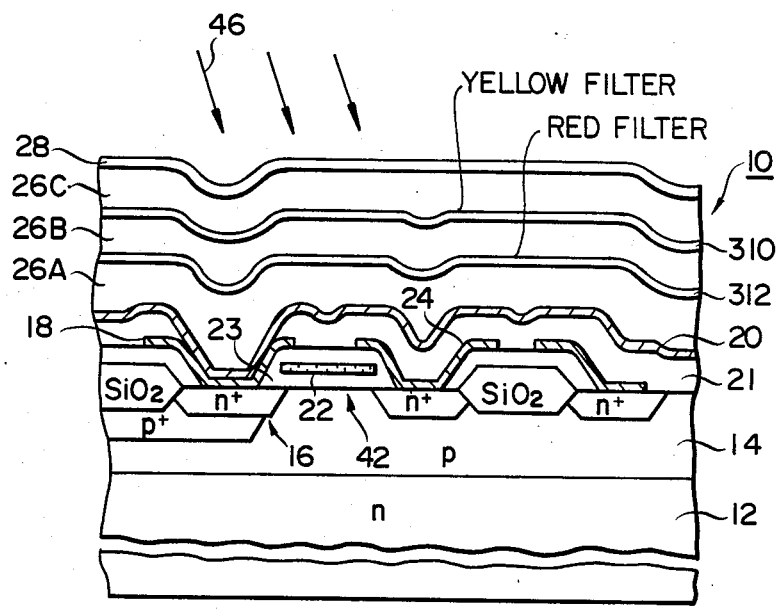

FIG. 11 depicts still another embodiment of the present invention. In this example, an optical filter layer 310 is disposed between adjacent layers 26C and 26B, and an optical filter layer 312 is disposed between adjacent layers 26B and 26A. The upper filter layer 310 is formed of a yellow filter which substantially blocks blue light, whereas the lower filter layer 312 is a red-light-passing filter which passes red light. These filter layers 310 and 312 are made of materials which allow photocarriers to pass therethrough. For instant, CdS or ZnCdS is advantageously adapted for the upper filter layer 310, while CdSTe or GaPAs is advantageously utilized for the lower filter layer 312. This provision may effectively prevent video signals associated with above-stated colors from being mixed with each other.

Although the present invention has been described in conjunction with above-stated embodiments of a still picture camera, it is apparent that the present invention can be applied to a movie camara in principle only if an optical shutter is provided in an image pickup optical system before an array of photosensitive cells.

The fundamental principle of the present invention can be also applied to the fall-time afterimage. In this case, a field of video signals are read out from an image pickup device at three time points during a period of time in which the fall-time after-image exists after the optical shutter is closed, and an arithmetic operation need only be executed in the same way as described before in order to generate three color component video signals through the color separation.

As can be seen from the description hereabove, the afterimage characteristics, which have been conventionally regarded as inherent drawbacks of the image pickup device of the layer-built type, are positively utilized for the color separation conducted on video signals in accordance with the present invention. As compared with the field sequential image pickup system, the present invention allows a system to be implemented for supplying video signals which do not cause color irregularity also with respect to a moving object. A color separation optical filter need not be especially disposed in the photosensitive cell array depending on the system configuration.

In accordance with the present invention, accordingly, there is provided imaging apparatus comprising an image pickup device for supplying video signals having undergone color separation, not causing any substantial color irregularity.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. Imaging apparatus comprising:
   a solid-state image pickup device including an array of photosensitive cells formed in a photoconductive layer on a semiconductor substrate;
   optical means for focusing an image of an object on said array;
   optical shutter means for introducing light from said optical means to said array for a desired exposure time period;
   read means for sequentially reading out picture element signals from said array of cells;
   store means for temporarily storing the picture element signals read out by said read means;
   operational means for reading out the stored picture element signals from said store means to form color-separated component video signals; and control means for controlling said read means, store means, and operational means in response to said shutter means, said control means causing said read means to read out a field of picture element signals from said array of cells to be stored in said store means at each of three time points within a time period extending from the beginning of the exposure time period to the end of an afterimage rise-time of said solid-state image pickup device, said operational means forming three color-separated component video signals from the three fields of picture element signals stored in said store means.

2. Apparatus according to claim 1 wherein said photoconductive layer comprises a single layer of an amorphous semiconductor material.

3. Apparatus according to claim 1 wherein said photoconductive layer compprises:

three first layers of an amorphous semiconductor material laminated over said substrate; and second layers each disposed between selected portions of adjacent ones of said first layers and comprising a non-photosensitive material which is substantially transparent with respect to light.

4. Apparatus according to claim 1 wherein said photoconductive layer comprises:

three first layers of an amorphous semiconductor material laminated over said substrate; and optical filter layers allowing photocarriers to pass therethrough, each being disposed between adjacent ones of said first layers, one of said optical filter layers disposed at an upper location with respect to a direction in which said incident light proceeds comprising a filter layer for passing yellow light, another of said optical filter layers disposed at a lower location with respect to the direction in which the incident light proceeds comprising a filter layer for passing red light.

5. A solid-state image pickup device comprising:
a semiconductor substrate; and
an array of photosensitive cells formed on the substrate so as to produce, when driven, color-separated component video signals proportional to light incident to the array, each of said photosensitive cells comprising,
a plurality of first layers of a photoconductive material laminated over said substrate, each sensitive to all wavelengths of visible light, and at least one second layer disposed between selected portions of adjacent ones of said first layers and comprising a non-photosensitive material which is substantially transparent with respect to the incident light.

6. A device according to claim 5 wherein each of said plurality of first layers comprises an amorphous semiconductor material.

7. A device according to claim 5 wherein said at least one second layer is formed in the shape of a net having scattered openings.

8. A device according to claim 5 wherein said at least one second layer is formed in the shape of islands spaced from each other.

9. A device according to claim 5 wherein
said plurality of first layers comprises three layers of a photoconductive material; and said at least one second layer comprises two layers of a non-photoconductive material each disposed between selected portions of adjacent ones of said first layers.

10. A solid-state image pickup device comprising:
a semiconductor substrate; and
an array of photosensitive cells formed on the substrate so as to produce, when driven, color-separated component video signals proportional to light incident to the array, each of said photosensitive cells comprising,
a plurality of first layers of a photoconductive material laminated over said substrate, and optical filter layers allowing photocarriers to pass therethrough, each being disposed between adjacent ones of said first layers, one of said optical filter layers disposed at an upper location with respect to a direction in which the incident light proceeds comprising a filter layer for passing yellow light, another of said optical filter layers disposed at a lower location with respect to the direction in which the incident light proceeds comprising a filter layer for passing red light.

11. A device according to claim 10 wherein each of said plurality of first layers comprises an amorphous semiconductor material.

12. A device according to claim 10 wherein
said plurality of first layers comprises three layers of a photoconductive material; and said optical filter layers comprise two layers of a non-photoconductive material each disposed between adjacent ones of said first layers.

* * * * *